(12) United States Patent
Nagami et al.

(10) Patent No.: US 7,286,426 B2
(45) Date of Patent: Oct. 23, 2007

(54) SEMICONDUCTOR MEMORY DEVICE

(75) Inventors: Atsushi Nagami, Tokyo (JP); Tatsushi Makino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/340,798

(22) Filed: Jan. 27, 2006

(65) Prior Publication Data

US 2006/0176755 A1    Aug. 10, 2006

(30) Foreign Application Priority Data

Feb. 4, 2005    (JP) .............................. 2005-029375

(51) Int. Cl.
*G11C 7/00* (2006.01)
*G11C 29/00* (2006.01)
(52) U.S. Cl. ...................... 365/205; 365/207; 365/208; 365/190; 365/201
(58) Field of Classification Search ................ 365/205, 365/207, 208, 190, 201
See application file for complete search history.

(56) References Cited

U.S. PATENT DOCUMENTS 5,022,007 A * 6/1991 Arimoto et al. ............ 365/201
5,544,108 A * 8/1996 Thomann .................... 365/201
5,894,445 A * 4/1999 Kobayashi .................. 365/208
6,169,696 B1 * 1/2001 Bissey ........................ 365/201
6,388,929 B1   5/2002 Shimano et al.
6,400,623 B2 * 6/2002 Ohno ......................... 365/201
6,487,137 B2 * 11/2002 Tsuboi et al. ............... 365/207
6,639,861 B2 * 10/2003 Stief et al. .................. 365/201

FOREIGN PATENT DOCUMENTS

JP            7-302497 A     11/1995
JP         2002-109899 A      4/2002

* cited by examiner

*Primary Examiner*—Trong Phan
(74) *Attorney, Agent, or Firm*—Sughrue Mion Pllc.

(57)    ABSTRACT

Disclosed is a semiconductor memory device which includes a sense amplifier, arranged between a first mat and a second mat, switches for controlling the connection between first and second bit lines of each of the first and second mats on one hand and the sense amplifier on the other, and a control unit for exercising control so that, when an input test mode signal indicates a test mode, both the switch associated with the selected mat and the switch associated with the non-selected mat will be turned on.

4 Claims, 4 Drawing Sheets

TIMING CHART FOR ILLUSTRATING THE REGULAR OPERATION

TIMING CHART FOR ILLUSTRATING THE OPERATION DURING THE TEST MODE

SEMICONDUCTOR MEMORY DEVICE

FIELD OF THE INVENTION

This invention relates to a semiconductor memory device. More particularly, this invention relates to a semiconductor memory device having a shared sense amplifier and being suited for device testing.

BACKGROUND OF THE INVENTION

In the production of DRAM (dynamic random access memories) devices, a wafer test and a final test are executed to screen out or sort a fail device which has a defect produced for example in the fabrication process, such as a short circuit between interconnect wires, a non-opening of a contact hole and a short circuit between memory cells. In the wafer test using a wafer prober, a defective cell of the DRAM device is replaced with a redundant memory cell provided in the DRAM device. After the completion of assembly of the DRAM device, the final test is executed using a tester connected with an auto-handler.

In a wafer test or a screening process, a wide variety of accelerated tests need to be executed to guarantee the operation of the device under all environments in the filed and to prevent an initial field incidence ascribable to deterioration of the device and hence an acceleration means for enabling stabilized volume production of the devices is crucial. As the accelerated test of the DRAM devices, for example, an accelerated test of power supply voltage, an accelerated test of operating speed or an accelerated test of tREF (refresh cycle), to say nothing of an accelerated test of operating temperature are executed.

FIG. 4 is a diagram showing the typical configuration of a semiconductor memory device (a DRAM employing a shared sense amplifier). The semiconductor memory device includes a shared sense amplifier 30, used in common by a bit line pair DL1 and /DL1 of a mat1 (MAT1) 11 and a bit line pair DL2 and /DL2 of a mat2 (MAT2) 12, a pair of transfer gates 211 and 212 (path transistors composed by n-channel MOS transistors) for controlling the connection between the bit line pair DL1 and /DL1 of the mat1 (MAT1) and the sense amplifier 30, and a pair of transfer gates 221 and 222 for controlling the connection between the bit line pair DL2 and /DL2 of the mat2 (MAT2) 12 and the sense amplifier 30. The semiconductor memory device also includes sub-word drivers 51 and 52, for driving sub-word lines WL 10 and WL 20, and TG drivers 41 and 42, which receives a MAT1 selection signal and a MAT2 selection signal, respectively, and output signals TG1 and TG2, respectively. The signal TG1 is for performing on/off control of the transfer gates 211 and 212, and the signal TG2 is for performing on/off control of the transfer gates 221, and 222. An output of the sense amplifier 30 is connected via a Y switch, not shown, to an I/O bus line.

The operation of the configuration shown in FIG. 4 will now be described. When the cell connected to the bit line pair DL1 or /DL1 of the MAT1 is to be read, the TG driver 42 set the signal TG2, as its output, to a LOW level, to turn off the transfer gates $22_1$ and $22_2$, for isolating the bit line pair DL2 and /DL2 which is not selected from the sense amplifier 30. The TG driver 41 sets the signal TG1 to a HIGH level to turn on the transfer gates $21_1$ and $21_2$, thereby connecting the a bit line pair DL1 and /DL1 in the MAT1 to the sense amplifier 30. The sub-word driver 51 raises the potential of a selected word line WL10 to a high level. When the selected word line WL10 is raised in its potential, in this manner, the memory cell which is connected to the selected word line, is connected to the bit line DL1. A minor differential voltage (initial differential voltage) is generated between the bit line pair DL1 and /DL1. The sense amplifier 30 amplifies this initial differential voltage to carry out the read operation. At this time, the bit line pair DL2 and /DL2 remains in the precharged state.

As for the shared sense amplifier, reference is to be made to the description of, for example, the Patent Document 1. There is disclosed in Patent Document 2 the connection control of a sense amplifier and a switch.

[Patent Document 1]
JP Patent Kokai Publication No. JP-P2002-109899A
[Patent Document 2]
JP Patent Kokai Publication No. JP-A-07-302497

SUMMARY OF THE DISCLOSURE

One of the defects generated in the DRAM fabrication process is the nonconformance that the memory cell capacitance (Cs) becomes smaller than a nominal value thereof.

In case the memory cell capacitance (Cs) is small, the initial differential voltage supplied to the sense amplifier becomes small, at the time of the sense operation in a read access, thus giving rise to an erroneous sensing. If the erroneous sensing should arise in an easy or simple functional test, there is raised no particular problem because a defective cell may be replaced with a redundant memory, in for example, a wafer test. However, if the erroneous sensing cannot be detected by the easy functional test or a tREF (refresh cycle) test, it may become necessary to detect the erroneous sensing using a variety of accelerated tests, thus protracting the test time.

Accordingly, it is an object of the present invention to provide a semiconductor memory device in which test time may be prevented from increasing.

It is another object of the present invention to provide a semiconductor memory device in which it is possible to avoid the occurrence of erroneous detection of a memory cell having a small cell capacitance.

The above and other objects are attained by the present invention having the following configuration.

A semiconductor memory device according to the present invention comprises: first and second mats, each including a plurality of memory cells; a sense amplifier shared by said first and second mats; a first switch for controlling the connection between said sense amplifier and a bit line of said first mat; a second switch for controlling the connection between said sense amplifier and a bit line of said second mat; and a control circuit for receiving a test mode signal and performing control so that in case of said test mode signal indicating a test mode, the first and second switches, one of which is associated with the selected mat and the other of which is associated with the non-selected mat are both set to be in an on state.

A semiconductor memory method according to the present invention includes a step of exercising control so that, out of first and second switches controlling the connection to the sense amplifier of bit lines of the first and second mats, both the switch associated with the selected mat and the switch associated with the non-selected mat will be turned on when a test mode entered indicates a test mode.

The meritorious effects of the present invention are summarized as follows.

According to the present invention, the initial differential voltage at the time of sensing can be accelerated to one-half of that with the state-of-the-art technique, thus allowing for reduction of the test time needed in complex tests used in the state-of-the-art technique, such as sense timing acceleration or data pattern acceleration.

According to the present invention, the defective memory cell, which it was not possible to detect with the state-of-the-art accelerated tests, may be detected.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE INVENTION

PREFERRED EMBODIMENTS OF THE INVENTION

Figure 1:
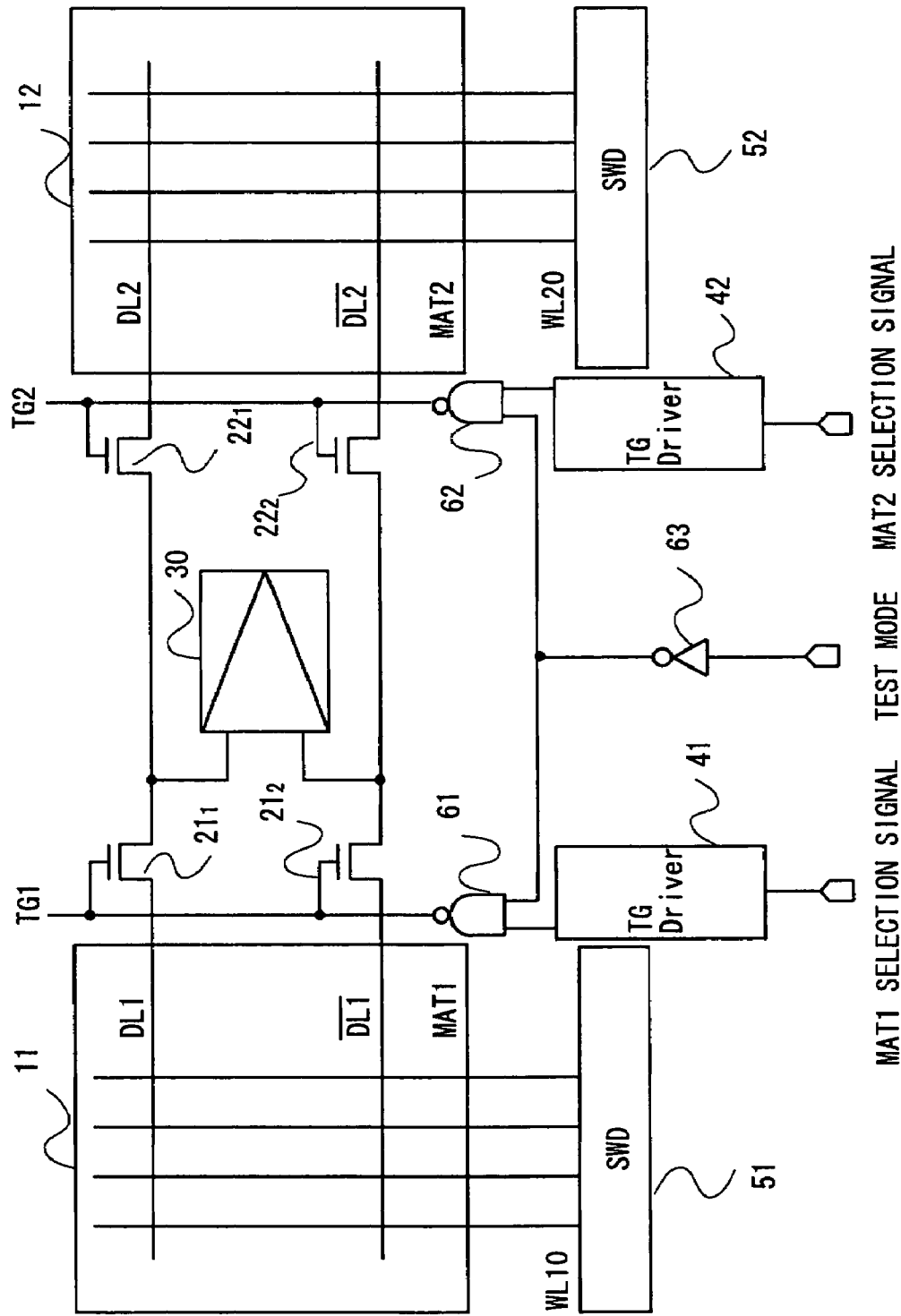
FIG. 1 is a diagram showing the configuration of an embodiment of the present invention.

Referring to the drawings, a preferred embodiment of the present invention will be described in detail. FIG. 1 shows the configuration of an embodiment of the present invention. Drivers 41 and 42, outputting signals TG1 and TG2 which are for controlling the connection between bit line pairs and a sense amplifier, respectively, are adapted to cause the control signal for a non-selected side to be kept at an activation level, based upon a test mode signal. In more detail, there are provided, as shown in FIG. 1, a shared sense amplifier 30, used in common by a bit line pair DL1 and /DL1 of a mat1 (MAT1) 11 and a by bit line pair DL2 and /DL2 of a mat2 (MAT2) 12, transfer gates $21_1$ and $21_2$, for controlling the connection between the bit line pair DL1 and /DL1 of the mat 1 (MAT1) and the sense amplifier 30, based upon a control signal TG1 supplied to gate terminals thereof, and a pair of transfer gates $22_1$ and $22_2$ for controlling the connection between the bit line pair DL2 and /DL2 of the mat2 (MAT2) 12 and the sense amplifier 30, based upon a control signal TG2 supplied to gate terminals thereof. There are also provided sub-word drivers 51 and 52 for driving sub-word lines WL 10 and WL 20 of mat1 and mat2, respectively, a TG driver 41, a TG driver 42, NAND circuit 61 for taking a negative logical product between an output signal of an inverter 63 which receives and inverts a test mode signal and an output signal of the TG driver 41, and NAND circuits 62 for taking a negative logical product between an output signal of an inverter 63 and an output signal of the TG driver 43. Output signals of the NAND circuits 61 and 62 are supplied, as control signals TG1 and TG2, to the gate terminals of the transfer gates $21_1$ and $21_2$, and to the gate terminals of the transfer gates $22_1$ and $22_2$, respectively. Although FIG. 1 refers to a DRAM of the hierarchical word line structure, employing a sub-word line and a main word line (not shown), it is to be noted that the present invention is not limited to the DRAM of the hierarchical word line structure. The transfer gates $21_1$ and $21_2$ and the transfer gates $22_1$ and $22_2$ are formed by n-channel MOS transistors, only by way of illustration, and may also be formed by p-channel MOS transistors or CMOS transfer gates. If the transfer gates $21_1$ and $21_2$ and the transfer gates $22_1$ and $22_2$ are formed by n-channel MOS transistors, the TG drivers 41 and 42, when selected, output low level signals and, when not selected, output high level signals.

Figure 2:
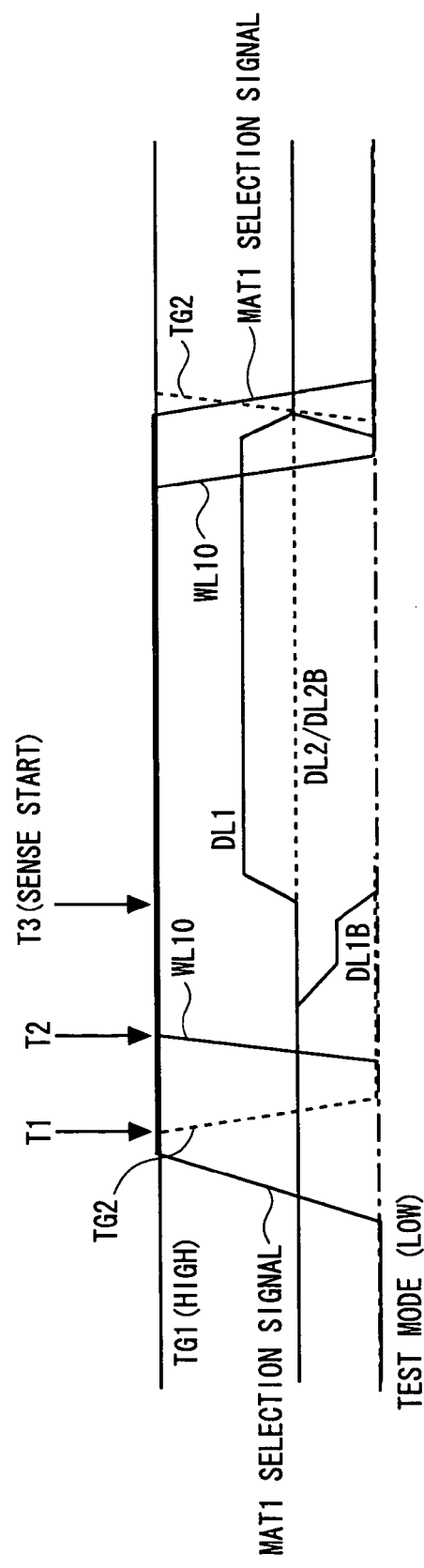
FIG. 2 is a timing chart for illustrating the normal operation according to the embodiment of the present invention.

FIG. 2 is a timing chart for illustrating the operation for the normal operation of an embodiment of the present invention (test mode signal=LOW level). When the test mode signal is LOW, the test mode is not used, that is, the normal operation mode. An output of the inverter 63 is then HIGH. When the bit line pair DL1 and /DL1 of the MAT1 is to be read, a MAT1 selection signal becomes HIGH, with the output of the TG driver 41 then becoming LOW, while a MAT2 selection signal becomes LOW, with the output of the TG driver 42 then becoming HIGH. The output signal TG1 of the NAND circuit 61 becomes HIGH, while the output signal TG2 of the NAND circuit 62 becomes LOW. That is, for separating the non-selected bit line pair DL2 and /DL2 from the sense amplifier 30, the TG2 signal is set to a LOW level (at time T1), while the TG1 signal is set to a HIGH level to raise the potential of a word line WL 10 (at time T2). When the word line WL10 rises to a high potential, the memory cell is connected to the bit line DL1, and a minor differential voltage (initial differential voltage) is produced (time point T3) between the bit line pair DL1 and /DL1. The sense amplifier 30 amplifies the initial differential voltage between the bit line pair DL1 and /DL1 to carry out the read operation. The bit line pair DL2 and /DL2 remains in the precharged state.

Figure 3:
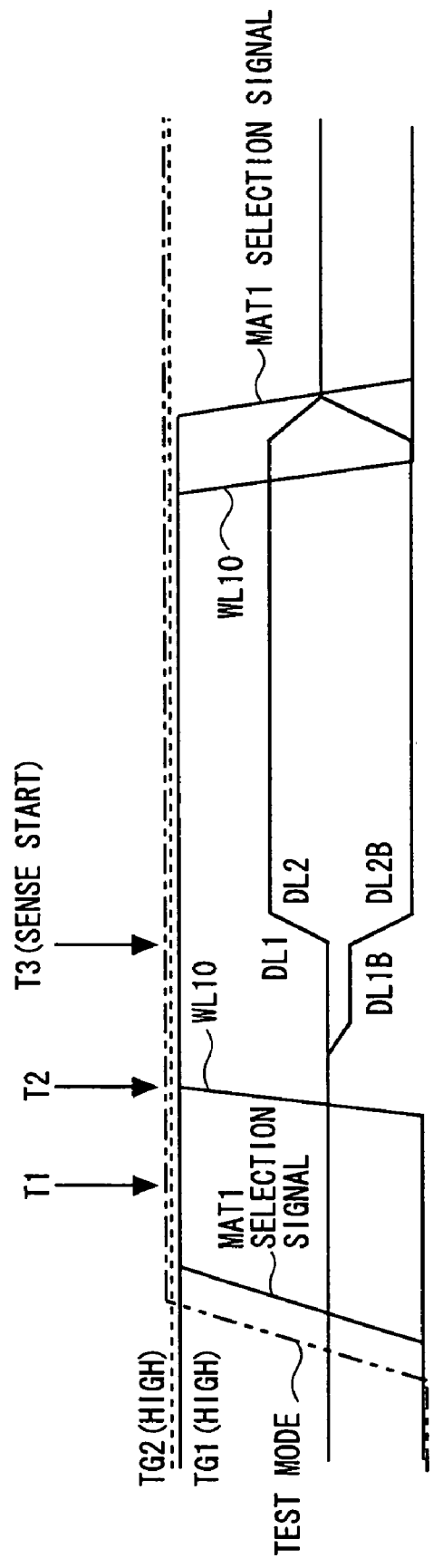
FIG. 3 is a timing chart for illustrating the operation in the test mode according to the embodiment of the present invention.
Figure 4:
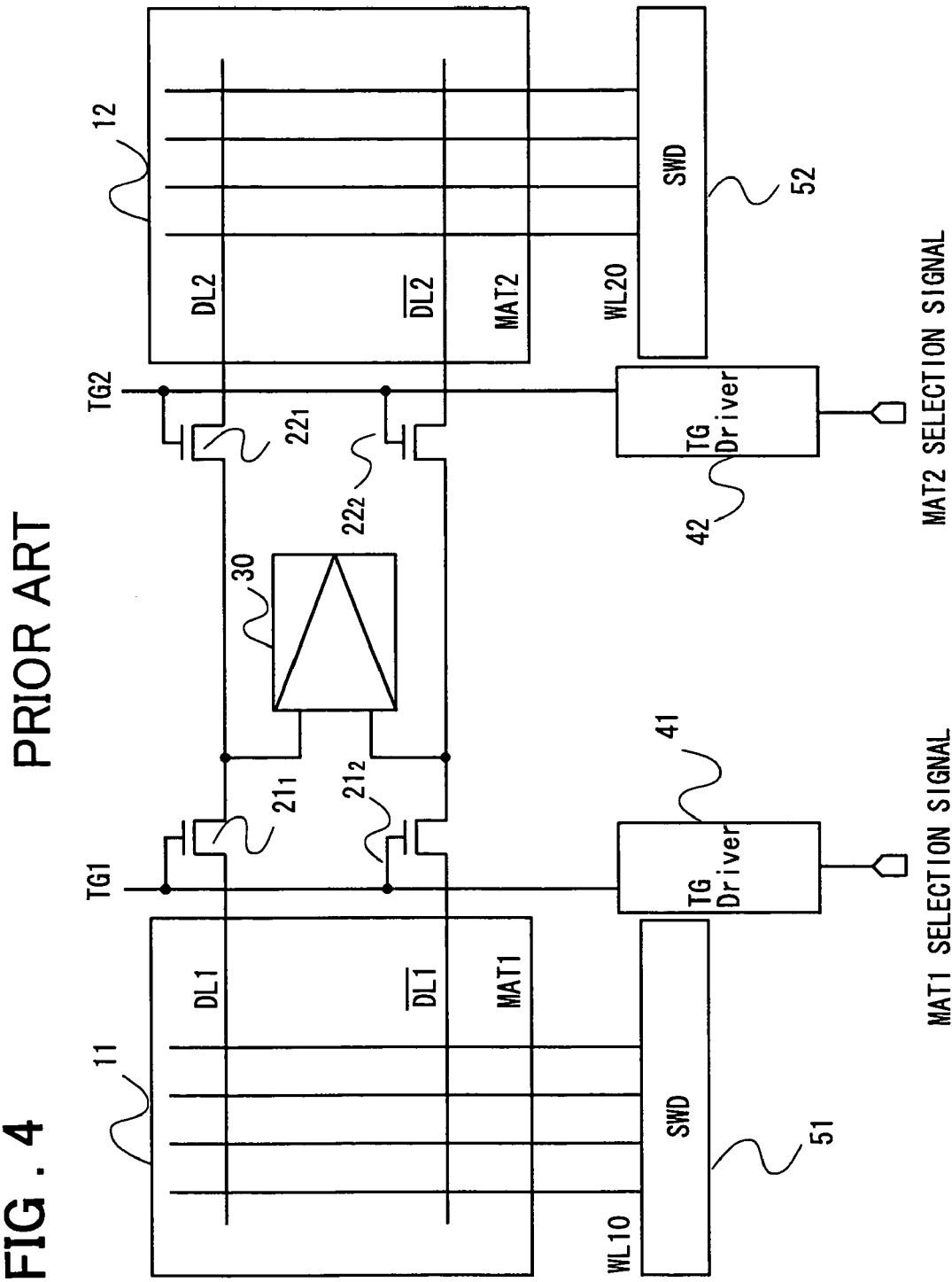
FIG. 4 is a diagram showing the configuration of a conventional semiconductor memory device.

FIG. 3 is a timing chart for illustrating the operation at the time of using a test mode according to an embodiment of the present embodiment. The output of the inverter 63 is set to a LOW level by setting the test mode signal to a HIGH level. The MAT1 selection signal becomes HIGH, the output of the TG driver 41 becomes LOW, the MAT2 selection signal becomes LOW and the output of the TG driver 42 becomes HIGH. The NAND circuit 61, which receives the LOW level test mode signal at an input terminal thereof, outputs a HIGH level without dependency upon an output value of the TG driver 41. Similarly, the NAND circuit 62, which receives the LOW level test mode signal, outputs a HIGH level without dependency upon an output value of the TG driver 42. More specifically, the TG1 signal is set to a HIGH level when the word line WL10 rises (at time T2). The transfer gates $21_1$ and $21_2$ are turned on. The TG2 signal goes HIGH (at time T1), thus in a manner which is not the same as during the normal operation. The transfer gates $22_1$ and $22_2$ are turned on. When the word line WL10 rises (time T2), the memory cell is connected to the bit line DL2 as well, in addition to being connected to the bit line DL1.

Assuming the capacitance of the memory cell and the capacitance of the bit line are Cs and Cd respectively, the initial differential voltage ΔV is proportionate to 1/(1+Cd/Cs).

Assuming that the voltage across the terminals of the cell capacitance Cs is V, we have $$CsV=(Cs+Cd)\Delta V,$$

From the above equation, the initial differential voltage ΔV is given as follows:

$$\Delta V = C_s V/(C_s + C_d) = V/(1 + C_d/C_s).$$

That is, if, in the present embodiment, the test mode signal is used, the capacitance Cd of the bit line is approximately doubled (that is, becomes equal to the sum of the capacitances of DL1 and DL2), such that the initial differential voltage applied to the sense amplifier 30 is approximately halved.

With the present embodiment, the initial differential voltage at the time of sense read operation may be halved, by way of acceleration, thus enabling shortening of the test time needed in complicated tests such as sense timing acceleration or data pattern acceleration. With the present embodiment, it also becomes possible to detect malfunctioning memory cells that cannot be detected with the state-of-the-art accelerated tests, such as memory cells with small memory capacitance Cs.

Although the present invention has been described in the foregoing with reference to the above-described embodiment, the present invention is not limited to the configuration of the above embodiment, and a variety of changes or correction that may occur to those skilled in the art may naturally be attempted without departing from the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   first and second mats, each including a plurality of memory cells;
   a sense amplifier shared by said first and second mats;
   a first switch for controlling the connection between said sense amplifier and a bit line of said first mat;
   a second switch for controlling the connection between said sense amplifier and a bit line of said second mat;
   a control circuit for receiving a test mode signal and performing control so that in case of said test mode signal indicating a test mode, said first and second switches, one of which is associated with the selected mat and the other of which is associated with the non-selected mat are both set to be in an on state;
   a first driver circuit for receiving a first mat selection signal, and outputting a signal which is for turning said first switch on when said first mat selection signal indicates a selected state;
   a second driver circuit for receiving a second mat selection signal, and outputting a signal which is for turning said second switch on when said second mat selection signal indicates a selected state;
   a first logic circuit for receiving an output signal of said first driver circuit and said test mode signal, said first logic circuit activating an output without dependency on the value of the output signal of said first driver circuit when said test mode signal indicates the test mode, said first logic circuit outputting a signal corresponding to the output of said first driver circuit when said test mode signal indicates a normal operation; and
   a second logic circuit for receiving an output signal of said second driver circuit and said lest mode signal, said second logic circuit activating an output without dependency on the value of the output signal of said second driver circuit when said test mode signal indicates a test mode, said second logic circuit outputting a signal corresponding to the output of said second driver circuit when said test mode signal indicates a normal operation mode;
   output signals of said first and second logic circuits being supplied to control terminals of said first and second switches as signals controlling the on/off of said first and second switches.

2. The semiconductor memory device according to claim 1, wherein said control circuit performs control so that in case of said test mode signal indicating a normal operation, only the one of the first and second switches associated with the selected mat is set to be in an on state.

3. The semiconductor memory device according to claim 1, wherein, in the test mode, data of a memory cell of the selected one of the first and second mats is read by said sense amplifier, with said first and second switches both being turned on.

4. The semiconductor memory device according to claim 1, wherein said first switch includes a pair of transfer gates inserted between said sense amplifier and a bit line pair of said first mat and having gate terminals connected in common to an output of said first logic circuit; and
   said second switch includes a pair of transfer gates inserted between said sense amplifier and a bit line pair of said second mat and having gate terminals connected in common to an output of said second logic circuit.

* * * * *